United States Patent [19]
Gilton

[11] Patent Number: 5,232,749
[45] Date of Patent: Aug. 3, 1993

[54] FORMATION OF SELF-LIMITING FILMS BY PHOTOEMISSION INDUCED VAPOR DEPOSITION

[75] Inventor: Terry L. Gilton, Boise, Id.

[73] Assignee: Micron Technology, Inc., Boise, Id.

[21] Appl. No.: 914,620

[22] Filed: Jul. 14, 1992

Related U.S. Application Data

[63] Continuation-in-part of Ser. No. 694,011, Apr. 30, 1991, Pat. No. 5,129,991.

[51] Int. Cl.⁵ .................... B05D 3/06; C23C 16/00
[52] U.S. Cl. .................... 427/558; 156/643; 156/635; 427/249
[58] Field of Search ......... 427/558, 572, 586, 590, 427/595, 248.1, 249; 156/35, 643, 656, 657, 662

[56] References Cited

U.S. PATENT DOCUMENTS

| | | | |
|---|---|---|---|
| 4,615,904 | 10/1986 | Ehrlich et al. | 427/558 X |
| 5,079,600 | 1/1992 | Schnur et al. | 427/558 X |
| 5,129,991 | 7/1992 | Gilton | 156/635 |

*Primary Examiner*—William A. Powell
*Attorney, Agent, or Firm*—Michael W. Starkweather

[57] ABSTRACT

A method of forming an adherent, self-limiting film of a predetermined thickness on a substrate by irradiating the substrate material with photons having an energy greater than the material's photoemission threshold (PET), causing secondary electrons to be emitted from the substrate's surface. The emitted secondary electrons are reacted with a precursor gas to form one or more reactive intermediates, which in turn react to form a film on the substrate. The film formed is essentially transparent to the incident photon irradiation, and does not appreciably reduce the photon flux reaching the surface. The film material has a PET which is greater than that of the substrate, and therefore does not emit secondary electrons in response to the photon radiation. Additionally, the film is only partially transmissive of secondary electrons emitted from the substrate surface. As the film grows, fewer of the emitted electrons are able to escape from the surface of the film to react with the precursor gas. The film continues to grow in thickness until a thickness is reached at which no secondary electrons are able to escape to react with the precursor gas, and the film formation reaction stops. Continued irradiation of the substrate results in no further film growth since secondary electrons are not able to escape the film to react with the precursor gas.

13 Claims, 2 Drawing Sheets

FORMATION OF SELF-LIMITING FILMS BY PHOTOEMISSION INDUCED VAPOR DEPOSITION

RELATED APPLICATIONS

This application is a continuation-in-part of Ser. No. 07/694,011, filed Apr. 30, 1991, U.S. Pat. No. 5,129,991, and hereby incorporates by reference the disclosure thereof.

FIELD OF THE INVENTION

This invention relates to a process for depositing self-limiting films on the surface of a substrate such as may useful in the manufacture of a semiconductor device, an integrated circuit, or a photovoltaic device.

BACKGROUND OF THE INVENTION

Modern manufacturing processes for semiconductor devices and integrated circuits normally include subjecting a substrate to a series of film formation and etching steps to form multi-filmed circuits and devices in situ. Processes for forming films of material over substrates are known to include thermal oxidation for formation of oxide films, pyrolysis, chemical vapor deposition (CVD), low pressure chemical vapor deposition (LPCVD), plasma enhanced chemical vapor deposition (PECVD), and evaporation processes such as electron beam evaporation. It is also known that the rate of CVD and PECVD can be enhanced by irradiating the surface with a laser or ultraviolet light (photo CVD).

In each of the above-mentioned processes, the rate of film formation is dependent on temperature and reactant concentrations, and in the case of photo CVD, the intensity of the radiation. The changes in deposition rate caused by relatively small changes one or more of these factors can be used advantageously in some instances. More often, however, the effect of minor changes in temperature and reactant concentrations on deposition rate render control of the process for depositing a precise thickness of material very difficult.

Notwithstanding difficulties in accurately controlling process parameters which affect the deposition rate, the ultimate thickness of the film is time dependent in each of these processes; the film will continue to grow in thickness as long as the required reactants and conditions are present. Since very precise control of the film thickness is required, these processes provide a very narrow process window. A relatively small variation processing time will result in a film thickness different from that desired.

It would be useful in many cases to be free of the effects of minor variations in process conditions on film thickness, and to have a wider process window in one or more steps of device manufacture for enhancing process flexibility.

SUMMARY OF THE INVENTION

Irradiation of a substrate material with photons having an energy greater than the material's photoemission threshold (PET) causes secondary electrons to be emitted from the substrate's surface. The present invention take advantage of this behavior to form an adherent, self-limiting film of a predetermined thickness on a substrate. The process includes irradiating the substrate with photons having an energy greater than the substrate's PET, and reacting the emitted secondary electrons with a precursor gas to form one or more reactive intermediates, which in turn react to form a film on the substrate. The film formed is essentially transparent to the incident photon irradiation, and does not appreciably reduce the photon flux reaching the surface. Since the film material has a PET which is greater than that of the substrate, the film does not emit secondary electrons in response to the photon radiation, and is only partially transmissive of secondary electrons emitted from the substrate surface. As the film grows, fewer of the emitted electrons are able to escape from the surface of the film to react with the precursor gas. The film continues to grow in thickness until a thickness is reached at which no secondary electrons are able to escape to react with the precursor gas, and the film formation reaction stops. Continued irradiation of the substrate results in no further film growth since secondary electrons are not able to escape the film to react with the precursor gas.

The maximum film thickness is dependent only on the energy level of the secondary electrons emitted from the substrate surface, which in turn is determined exclusively by the energy level of photons impacting the substrate surface. Other process parameters such as reactant concentration or processing time do not affect the maximum film thickness, providing an open-ended process window.

The process has particular utility in the manufacture of integrated circuits and semiconductor devices where it provides an extremely wide process window, and yields a uniform film of a precise thickness which is dependent only on the photon energy of the radiation impacting the substrate surface.

The present invention will now be described in its preferred embodiment by reference to the Figures and the following examples.

DETAILED DESCRIPTION OF THE PREFERRED EMBODIMENT

The present invention is directed to a process for forming a self-limiting film on the surface of a substrate by photoemission-induced vapor deposition. Photoemission-induced vapor deposition is defined as the process of photon bombardment of a substrate to generate secondary electrons which initiate one or more vapor deposition reactions, resulting in the formation of a solid film on the substrate surface. The photon source is selected to generate photons having an energy at least as great as the photoemission threshold (PET) of the substrate which, for purposes of this application, is defined as the minimum energy of impinging photons which will cause secondary electrons to be ejected from the substrate surface. The vapor deposition reaction is selected to form a film which is transparent to the impinging photons, allowing them to pass substantially unimpeded to the substrate surface. The film to be formed is selected to have a PET greater the energy of the impinging photons, and therefore does not emit secondary electrons as a result of the photon bombardment. Finally, the film is selected to be attenuative of secondary electrons emitted from the substrate. As the film grows, a thickness is reached where all of the secondary electrons emitted from the substrate are absorbed by the film, thereby limiting the achievable thickness of the film since no secondary electrons can escape the film to initiate the vapor deposition reaction.

It is believed that the process of the present invention may be practiced on conductors, semiconductors, or insulators. It may be useful for depositing films of oxide, carbide, nitride, halides, or others. The present invention is understood to have utility in the field of semiconductor fabrication, where it is often useful or necessary to reliably form an adherent film over a substrate or a portion thereof. The preferred embodiment of the present invention is thereof described below in the context thereof. Doing so is not intended to limit the scope of the invention however.

Figure 2:
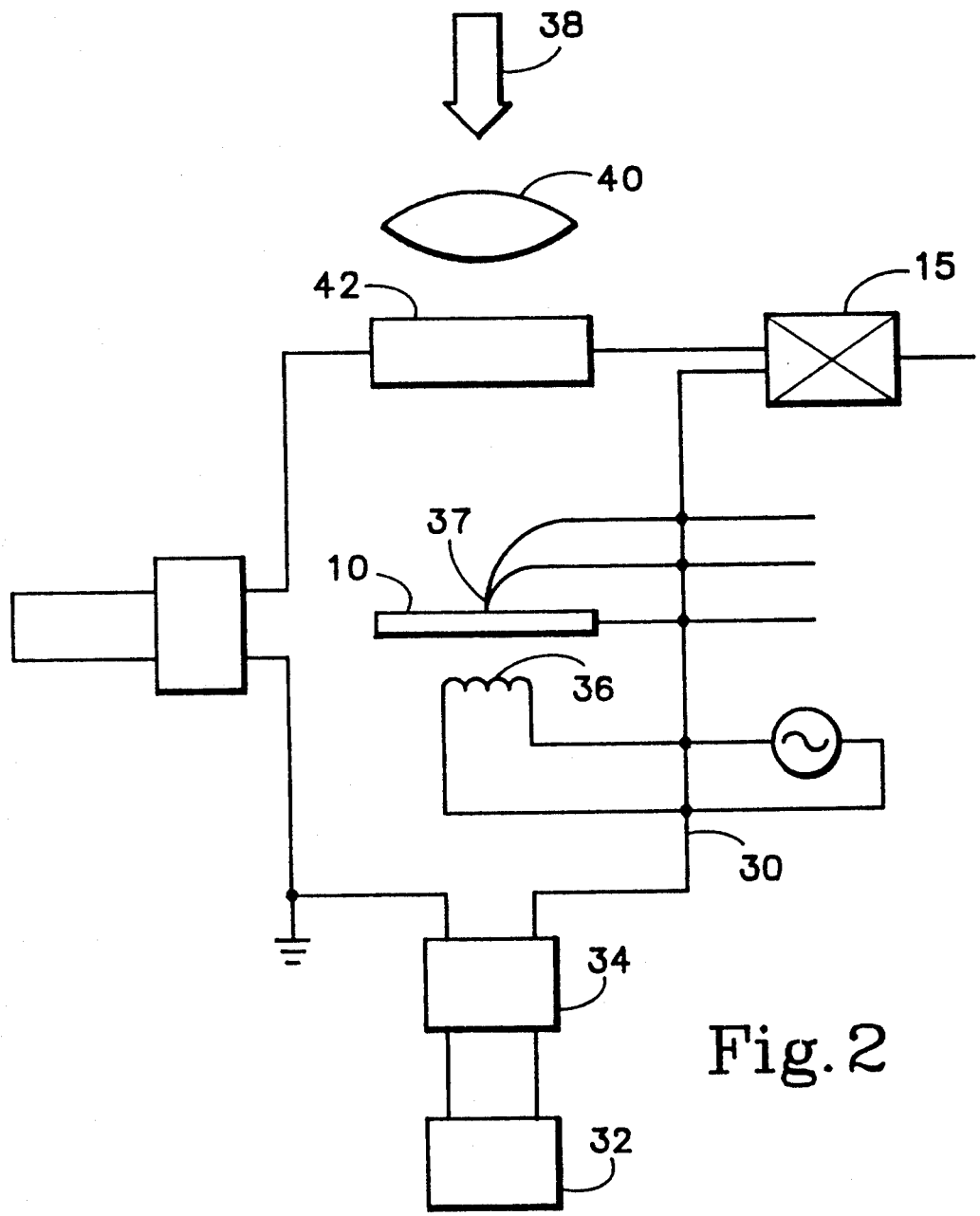
FIG. 2 shows a schematic representation of an apparatus used to practice the methods of the present invention.

The preferred embodiment of the invention will now be described with reference to the Figures. A substrate 10 upon which a film 11 is to be grown is provided within an evacuated chamber 30 (FIG. 2), which is maintained at a pressure of approximately $1\,e^{-4}$ torr. The substrate may be a conductor, a semiconductor, or an insulator. Substrate 10 may be a homogeneous body, or may include a discrete upper film, such as a metal, which has been previously deposited over a substrate. A reactant gas 14, selected as described to produce the desired film, is admitted to the evacuated chamber through leak valve 15. Substrate 10 is then irradiated with photons 16 having an energy (hv) greater than the photoemission threshold of the substrate 10, causing secondary electrons 17 to be emitted from surface 18 of substrate 10.

The photon source may be a laser such as a doubled dye laser driven by an excimer laser. An excimer laser alone may be used if one of the relatively few available wavelengths corresponds to the desired photon energy for a particular film. Alternatively, broad band UV radiation such as that generated by a mercury or Xenon lamp and filtered through a monochromator can be used to provide photons having the desired energy, albeit at a lower intensity. The lower intensity photon flux provided by a filtered broad band UV source will result in a lower film formation rate, but will not affect the ultimate thickness of the film, since maximum film thickness is a function solely of the energy level of the impinging photons. An example of another photon source would be cyclotron radiation, which goes into the deep UV and is variable into the visible.

Figure 1A:
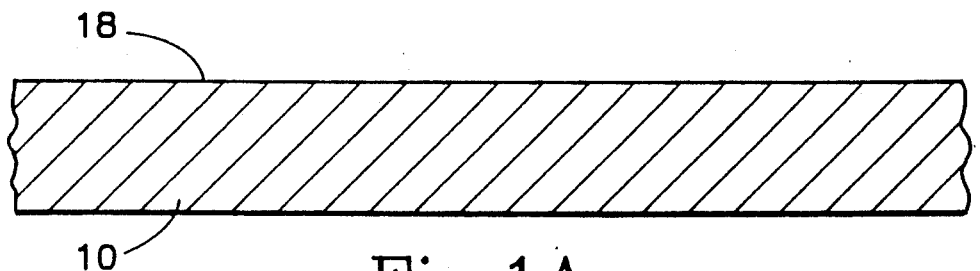
FIG. 1A shows a substrate upon which a self-limiting film is to be grown.
Figure 1B:
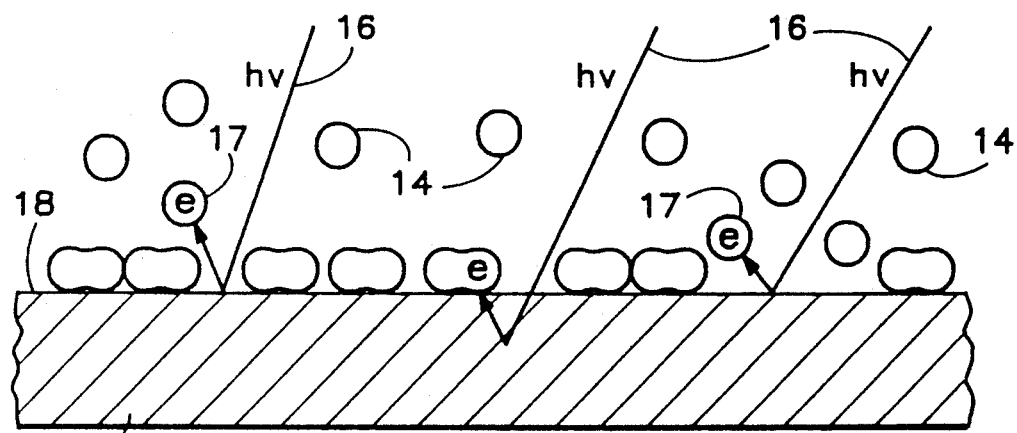
FIG. 1B shows electrons being emitted from a substrate which is being irradiated with photons exceeding the work function, and the electrons reacting with a gaseous reactant to form a film on the substrate.
Figure 1C:
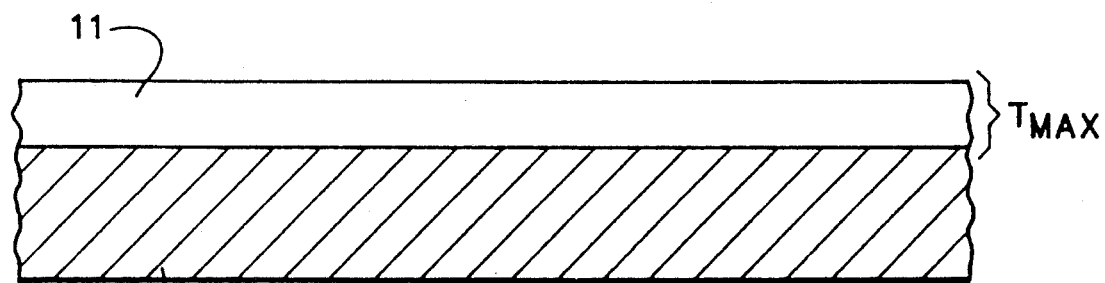
FIG. 1C shows a uniform film formed on a substrate according to the present invention, which has reached a sufficient thickness to completely attenuate the electron flux from the surface, thereby limiting the thickness of the film.

As substrate 10 continues to be irradiated, film 11 continues to grow until it reaches a thickness $t_{max}$ (FIG. 1C) through which secondary electrons 18 can no longer escape to react with reactant gas 14. At this point, the film formation reaction is stopped, and continued irradiation of substrate 10 has no further effect on the thickness of film 11. The process of the present invention to deposit self-limiting films on a substrate is further demonstrated by the following examples.

EXAMPLE 1

Substrate 10, a silicon substrate onto which a titanium film had been previously deposited, was provided for deposition thereon of a SiC film. Referring to the apparatus shown schematically in FIG. 2, substrate 10 was placed in main chamber 30. Chamber 30 was then evacuated by the operation of mechanical vacuum pump 32 and turbomolecular pump 34 to a pressure of $1 \times 10^{-7}$ torr. Terramethylsilane (TMS) was selected as the reactant gas to provide the constituents necessary for formation of the SiC film. TMS was admitted into chamber 30 through variable leak valve 35 at a rate sufficient to maintain the pressure in chamber 30 at about $1\,e^{-4}$ torr. Substrate 10 was then heated by use of filament heater 36 to about 200° C. as measured by thermocouple 37, and maintained under those conditions for 3 hours. The flow of TMS was stopped, and main chamber 30 vented before removal of substrate 10 from the apparatus. Analysis of substrate 10 by scanning Auger microprobe indicated that no film of SiC had been formed on substrate 10.

EXAMPLE 2

The conditions of example 1 were repeated in example 2 with the exception that in example 2, lamp 38 was energized to provide photon bombardment of substrate 10. A 75 watt Osram high pressure mercury vapor lamp was focused through an S-1 quartz window 40 and through shutter 42 onto substrate 10 for about 3 hours. Lamp 38 was then de-energized, and substrate 10 cooled. The flow of TMS was stopped, and main chamber 30 vented before removal of substrate 10 from the apparatus.

Examination and analysis of substrate 10 by scanning Auger microprobe indicated that a SiC had been deposited in a uniform film having a thickness of approximately 40 angstroms. Comparison of examples 1 and 2 indicate that exposure of substrate 10 to the photo bombardment provided by lamp 38 was necessary to grow the SiC film on the titanium substrate. Titanium has a photoemission threshold of 4.33 volts, corresponding to a wavelength of 286 nanometers, which is within the range of UV light emitted by lamp 38.

EXAMPLE 3

The conditions of example 2 were repeated in example 3, with the exception that substrate 10 was exposed to photon irradiation from lamp 38 for 5 hours. Examination and analysis of substrate 10 indicated that SiC had again been deposited in a uniform film having a thickness of approximately 40 angstroms. The additional photon bombardment in excess of 3 hours had not resulted in any additional growth of the SiC film on substrate 11, indicating that a limiting thickness of the SiC film had been reached within the 3 hour exposure time of example 2. Note that SiC is an insulator with a work function outside the range of UV light emitted by lamp 38.

EXAMPLE 4

The conditions of example 2 were repeated in example 4, with the exception that the substrate 10 in example 4 consisted of a silicon substrate onto which a film of nickel had been previously deposited, and that substrate 10 was exposed to the photon bombardment for 3 hours.

Analysis of substrate 10 after 3 hours indicated that SiC had been deposited on the nickel substrate in a film having a uniform thickness of approximately 20 angstroms. The work function of Ni is about 5.3 volts, corresponding to a wavelength of 234 nanometers. The reduced film thickness of the SiC film deposited on a Ni substrate is equivalent to the results expected from the use of a longer wavelength light. This is because the higher work function limits the maximum energy of photo-emitted electrons in exactly the same way a longer wavelength light would limit the energy for a constant work function.

EXAMPLE 5

The conditions of example 4 were repeated in example 5, with the exception that substrate 10 was exposed to photon irradiation from lamp 38 for 10 hours. Examination and analysis of substrate 10 indicated that SiC had again been deposited in a uniform film having a thickness of approximately 20 angstroms. The additional photon bombardment in excess of 3 hours had not resulted in any additional growth of the SiC film on substrate 11, indicating that a limiting thickness of the SiC film had been reached within the 10 hour exposure time of example 4.

As demonstrated by the foregoing examples, the process of the present invention results in the formation of self-limiting films on a substrate. The self-limiting nature of the film-formation process provides a significant advantage in the processing required to manufacture semiconductor devices or integrated circuits. The processes of the present invention will reliably produce films having a uniform, predetermined thickness, and provide an open-ended process window for doing so.

Those skilled in the art will recognize that numerous modifications and changes in details are possible without departing from the scope of the present invention. I claim all such modifications.

I claim:

1. A process for forming a film on a substrate surface comprising the steps of:
    (a) providing a substrate having an outer surface having a photoemission threshold above which electrons are emitted from said surface;
    (b) providing a reactant proximate said substrate surface;
    (c) irradiating said substrate surface with radiation having an energy exceeding the photoemission threshold of the surface, thereby causing electrons to be emitted from the substrate surface;
    (d) reacting said electrons emitted from said surface with said reactant to form a reactive intermediate;
    (e) reacting said reactive intermediate to form a film over said substrate surface, said film passing said radiation to said substrate surface, said film being attenuative of said electrons emitted from the substrate surface; and
    (f) forming said film to a thickness at which said electrons emitted from the substrate surface are effectively attenuated by said film.

2. The process of claim 1 wherein said film has a photoemission threshold greater than the photoemission threshold of the substrate surface.

3. The process of claim 1 wherein said reactant proximate to said substrate surface is adsorbed onto said substrate surface.

4. The process of claim 1 wherein said reactant comprises a gaseous reactant.

5. The process of claim 1 wherein said reactive intermediate comprises a gaseous ion.

6. The process of claim 1 wherein said reactant comprises one selected from the group comprising oxygen, nitrogen, halocarbons, organosilanes.

7. The process of claim 1 wherein said film is selected from the group comprising an oxide film, a nitride film, a halide film, and a carbide film.

8. The process of claim 1 wherein said substrate surface comprises silicon, said reactant comprises tetraethoxy silane, and said film comprises silicon dioxide.

9. The process of claim 1 wherein said substrate surface comprises titanium, said reactant comprises trimethylsilane, and said film comprises silicon carbide.

10. The process of claim 1 wherein said substrate surface comprises nickel, said reactant comprises trimethylsilane, and said film comprises silicon carbide.

11. The process of claim 1 wherein said substrate surface comprises a metal, and said film comprises an oxide of said metal.

12. The process of claim 1 wherein said substrate surface comprises a semiconductor, and said film comprises an oxide of said semiconductor.

13. The process of claim 1 wherein said substrate surface comprises a semiconductor, and said film comprises a carbide of said semiconductor.

* * * * *